United States Patent
Oh

(10) Patent No.: US 8,860,003 B2
(45) Date of Patent: Oct. 14, 2014

(54) RESISTIVE MEMORY DEVICE AND FABRICATION METHOD THEREOF

(71) Applicant: SK hynix Inc., Icheon-si (KR)

(72) Inventor: Jae Min Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 13/791,561

(22) Filed: Mar. 8, 2013

(65) Prior Publication Data
US 2013/0240824 A1    Sep. 19, 2013

(51) Int. Cl.
*H01L 47/00* (2006.01)
*H01L 45/00* (2006.01)
*H01L 27/24* (2006.01)

(52) U.S. Cl.
CPC ............ *H01L 45/06* (2013.01); *H01L 27/2472* (2013.01); *H01L 27/2409* (2013.01); *H01L 45/1273* (2013.01); *H01L 45/1233* (2013.01); *H01L 45/16* (2013.01)
USPC .............................................. 257/4; 438/382

(58) Field of Classification Search
USPC .............................................. 257/4; 438/382
See application file for complete search history.

(56) References Cited

U.S. PATENT DOCUMENTS

| 2009/0250679 A1* | 10/2009 | Jung ................................. 257/2 |
| 2010/0144090 A1* | 6/2010 | Song et al. .................... 438/104 |
| 2010/0252795 A1* | 10/2010 | Song et al. ........................ 257/2 |
| 2011/0186798 A1* | 8/2011 | Kwon et al. ...................... 257/2 |
| 2012/0007036 A1* | 1/2012 | Jung ................................. 257/4 |
| 2012/0009757 A1* | 1/2012 | Jung ............................. 438/382 |

* cited by examiner

*Primary Examiner* — Marvin Payen
(74) *Attorney, Agent, or Firm* — Kilpatrick Townsend & Stockton LLP

(57) ABSTRACT

A resistive memory device capable of implementing a multi-level cell (MLC) and a fabrication method thereof are provided. The resistive memory device includes a lower electrode connected to a switching device and including a first node and a second node formed on a top thereof to be spaced at a fixed interval, a phase-change material pattern formed on the first node and the second node, an upper electrode formed on the phase-change material pattern, a conductive material layer formed on a top and outer sidewall of the upper electrode, a first contact plug formed on one edge of the upper electrode to be connected to the upper electrode and the conductive material layer, and a second contact plug formed on the other edge of the upper electrode to be connected to the upper electrode and the conductive material layer.

5 Claims, 4 Drawing Sheets

RESISTIVE MEMORY DEVICE AND FABRICATION METHOD THEREOF

CROSS-REFERENCES TO RELATED APPLICATION

This application claims priority under 35 U.S.C. 119(a) to Korean application number 10-2012-0065802, filed on Jun. 19, 2012, in the Korean Patent Office, which is incorporated by reference in its entirety.

BACKGROUND

1. Technical Field

The inventive concept relates to a semiconductor device, and more particularly, to a resistive memory device and a method of fabricating the same.

2. Related Art

Nonvolatile memory devices, of which phase-change memory devices, flash memory devices, magnetic memory devices, and the like are representative, tend to be highly integrated with low cost based on multi-level cell technology.

The phase-change memory device among the nonvolatile memory devices are becoming practical alternatives to limitations for scaling of dynamic random access memories (DRAMs) and reliability of flash memory devices. In particular, the phase-change memory devices have advantages of nonvolatile characteristic, a high speed operation, stability, a non-erase operation, endurance, and access in units of bytes and therefore may be referred to as next-generation memory devices which are most suitable for storage class memories (SCMs).

The SCMs are applied as storage apparatus and/or main memory apparatus and the phase-change memory devices have to perform program and read operation fast and accurately with low power consumption so as to perform the functions.

Further, the phase-change memory devices have been developed in a multi-level cell (MLC) structure from a single-level cell (SLC) structure so as to be highly integrated. The method of controlling a pulse applied to a memory cell having the same structure as the SLC is mainly used so as to implement the MLC.

FIG. 1 is view illustrating a structure of a phase-change memory device.

As shown in FIG. 1, a switching device 103 is formed on a semiconductor substrate 101 in which a bottom structure is formed and a lower electrode 105 is formed to be electrically connected to the switching device 103. A phase-change material pattern 107 and an upper electrode 109 are formed on the lower electrode 105 and the upper electrode 109 is electrically connected to a bit line (not shown) through a contact plug 111.

FIG. 2 is a view illustrating an example of a pulse applied so as to cause a memory device having the structure of FIG. 1 to operate in the MLC.

First, FIG. 2(a) shows a single pulse mode and implements the MLC through a write-read process. In this pulse applying method, the applied pulse type is simple, but transition state between a "10" state and a "01" state is inaccurate.

FIG. 2(b) shows a first double pulse mode and implements the MLC through a reset current application-a write-read process. In this pulse applying method, a reset pulse is applied in advance before applying a program pulse so as to program a "10" state and a "01" state. Therefore, additional pulse is necessary in addition to a single pulse mode as shown in FIG. 2(a) and three pulse levels are necessary. However, an intermediate level such as "01" and "10" is easily formed.

Next, FIG. 2(c) shows a second double pulse mode. This pulse applying method is similar to the first double pulse mode in that a reset pulse is applied in advance before applying a program pulse so as to program a "10" state and a "01" state. However, the pulse applying method is different from the first double pulse mode in that a program pulse, which is applied to form an intermediate level, is configured in a slow quench type. This pulse applying method uses one pulse level and thus a configuration for a voltage pumping circuit can be simplified.

FIG. 2(d) shows a third double pulse mode and implements the MLC though a set current application-write-read process. This pulse applying method is similar to the method of FIG. 2(b). However, the pulse applying method is different from the method of FIG. 2(b) in that a set current is first applied.

FIG. 2(e) shows that the MLC is implemented through a program and verifying mode (PNV). The pulse applying method adds a verifying pulse to a single pulse mode and is the best mode to form a desired resistance state. However, the program period of time becomes long due to repeat of the program and verifying process.

As described above, at present, the MLC is implemented by applying the same cell structure as the cell structure applied to the SLC and changing only the pulse type. Therefore, the data level can be changed according to resistance drift or partial composition change in the phase-change material and, therefore, it is difficult to guarantee reliability due to increase in useful life of the memory device.

SUMMARY

One or more exemplary embodiments are provided to a resistive memory device capable of implementing a multi-level cell (MLC) and a method of fabricating the same.

According to one aspect of an exemplary embodiment, there is provided a resistive memory device. The resistive memory device may include: a lower electrode connected to a switching device and including a first node and a second node formed on a top thereof to be spaced at a fixed interval; a phase-change material pattern formed on the first node and the second node; an upper electrode formed on the phase-change material pattern; a conductive material layer formed on a top and outer sidewall of the upper electrode; a first contact plug formed on one edge of the upper electrode to be connected to the upper electrode and the conductive material layer; and a second contact plug formed on the other edge of the upper electrode to be connected to the upper electrode and the conductive material layer.

According to another aspect of an exemplary embodiment, there is provided a method of fabricating a resistive memory device. The method may include: providing a semiconductor substrate in which a switching device is formed; forming a lower electrode of which a bottom is connected to the switching device and a top includes a first node and a second node spaced at a fixed interval; forming and patterning a phase-change material layer and an upper electrode material so that the first node and the second node are connected to a phase-change material pattern; forming a conductive material layer on a top and outer sidewall of the upper electrode; forming an interlayer insulating layer on the semiconductor substrate including the conductive material layer and forming upper electrode contact holes, one of the upper electrode contact holes exposing one edge of the upper electrode and one edge of the conductive material layer and the other of the upper electrode contact holes exposing the other edge of the upper electrode and the other edge of the conductive material layer; and forming contact plugs to be deposited in the upper electrode contact holes.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
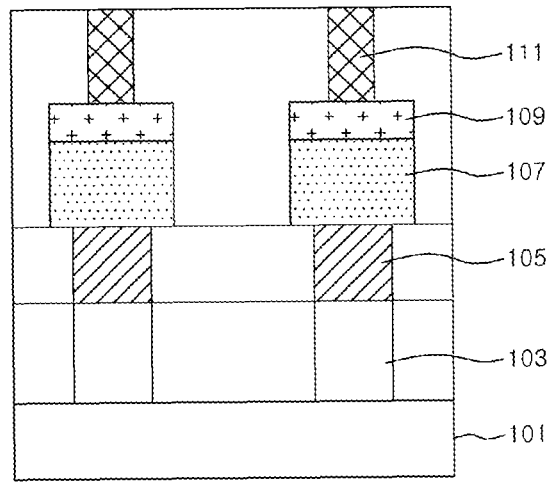
FIG. 1 is a cross-sectional view illustrating a general phase-change memory device.
Figure 2:
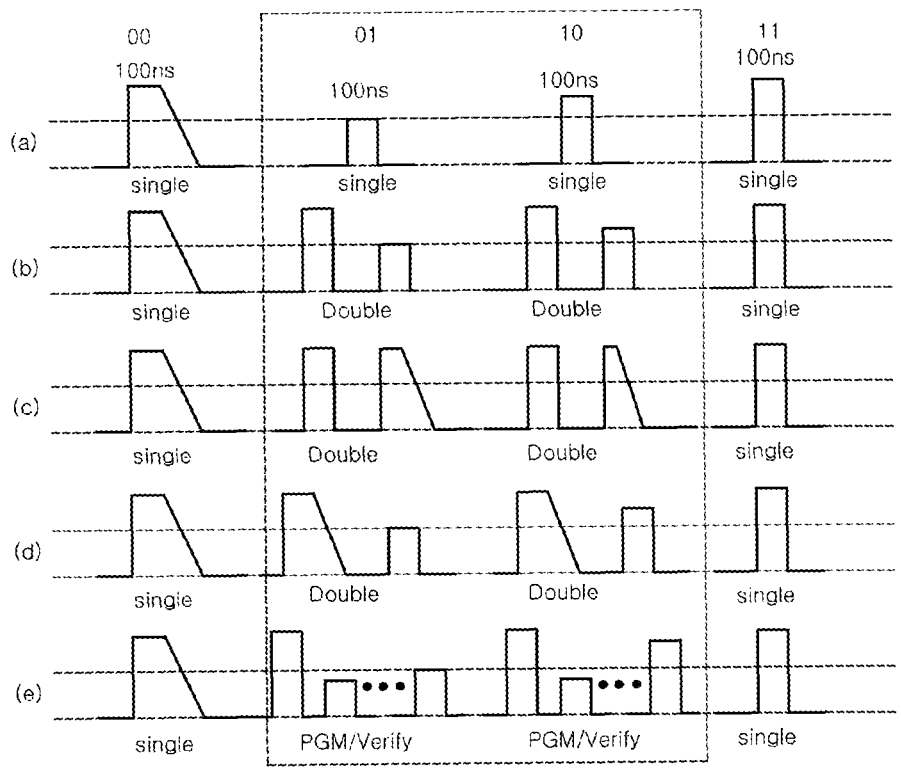
FIG. 2 is an illustrative view of a pulse applied to cause a general phase-change memory device to operate in a multi-level cell (MLC)

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 3 to 7 are cross-sectional views illustrating a method of fabricating a resistive memory device according to an exemplary embodiment of the inventive concept, in which FIGS. 3 to 7 are cross-sectional views in a first direction, for example, a word line direction.

Figure 3:
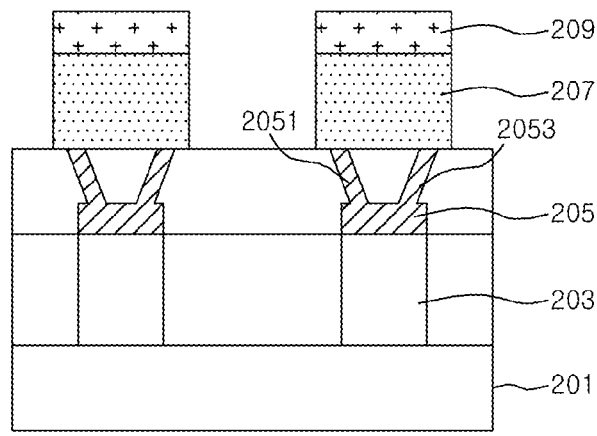
FIGS. 3 to 7 are cross-sectional views illustrating a method of fabricating a resistive memory device according to an exemplary embodiment of the inventive concept.

Referring to FIG. 3, a switching device 203 is formed on a semiconductor substrate 201 in which a bottom structure is formed and a lower electrode 205 electrically connected to the switching device 203 is formed. Subsequently, a phase-change material pattern 207 and an upper electrode 209 are formed on the lower electrode 205.

Here, the switching device may be a diode in some embodiments.

Further, the lower electrode 205 may be formed so that the lower electrode 205 may be connected to the switching device 203 through a single node and the lower electrode 205 may be connected to the phase-change material pattern 207 through at least two nodes 2051 and 20253. At this time, the first node 2051 and the second node 2053 may be formed to be spaced at a fixed interval. In the exemplary embodiment of the inventive concept, the space between the first node 2051 and the second node 2053 may be determined so that a region amorphized by the first node 2051 is not overlapped with a region amorphized by the second node 2053 when a crystalline state of the phase-change material pattern 207 is changed through the first node 2051 and the second node 2053.

Figure 4:
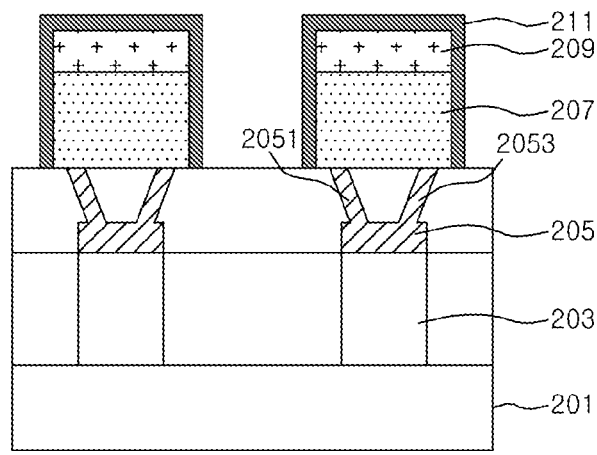

Referring to FIG. 4, a conductive material layer 211 is formed on the semiconductor substrate including the phase-change material pattern 207 and the upper electrode 209 and then separation between cells is performed in a word line direction through spacer etching. In some embodiments, conductive material layer 211 is deposited on the semiconductor substrate to cover the top surface and sidewalls of upper electrode 209 and the sidewalls of phase-change material pattern 207. An etch process is then performed to remove a portion of conductive material layer 211 to form separation between cells in a word line direction. In some embodiments, a mask can be formed on the top surface of upper electrode 209 before the etch process.

Figure 5:
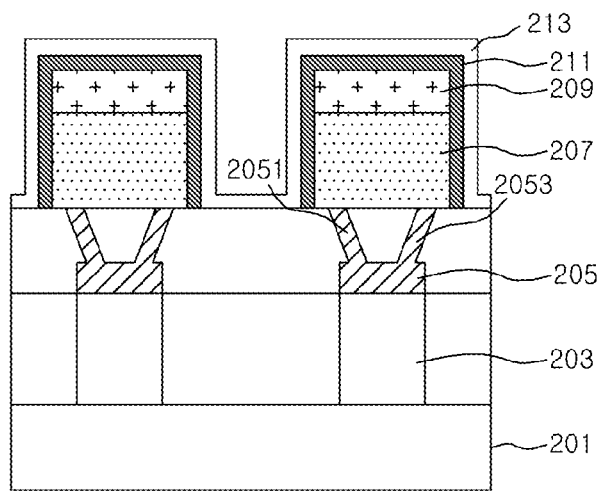

Referring to FIG. 5, a capping layer 213 is formed on the semiconductor substrate including the conductive material layer 211. The capping layer 213 may be formed, for example, using a material including nitride, but the material for the capping layer 213 is not limited thereto.

Figure 6:
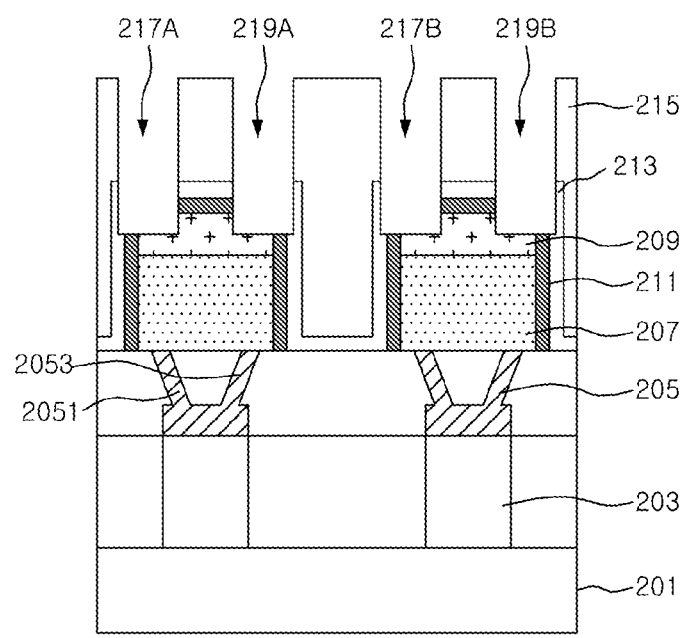

Referring to FIG. 6, an interlayer insulating layer 215 is formed on the capping layer 213. At least two upper electrode contact holes 217A/219A and 217B/219B are formed with respect to each cell. The first upper electrode contact hole 217A or 217B in each cell may be formed by etching the interlayer insulating layer 215, one edge of the capping layer 213, one edge of the conductive material layer 211, and one edge of the upper electrode 209 to a fixed height. The second upper electrode contact hole 219A or 219B in each cell may be formed by etching the interlayer insulating layer 215, the other edge of the capping layer 213, the other edge of the conductive material layer 211, the other edge of the upper electrode 209 to a fixed height.

A conductive material is deposited within the upper electrode contact holes 217A/219A and 217B/219B to form a first contact plug 221A/221B and a second contact plug 223A/223B. Here, the contact plugs 221A/223A and 221B/223B may be formed of, for example, tungsten (W), but the material for the contact plugs is not limited thereto.

Bit lines (Nor shown) are formed to be connected to the contact plugs 221A/223A and 221B/223B, respectively, after the contact plugs 221A/223A and 221B/223B are formed.

The contact plugs 221A/223A and 221B/223B may be formed to be mutually shared by two cells adjacent in a bit line direction.

Figure 8:
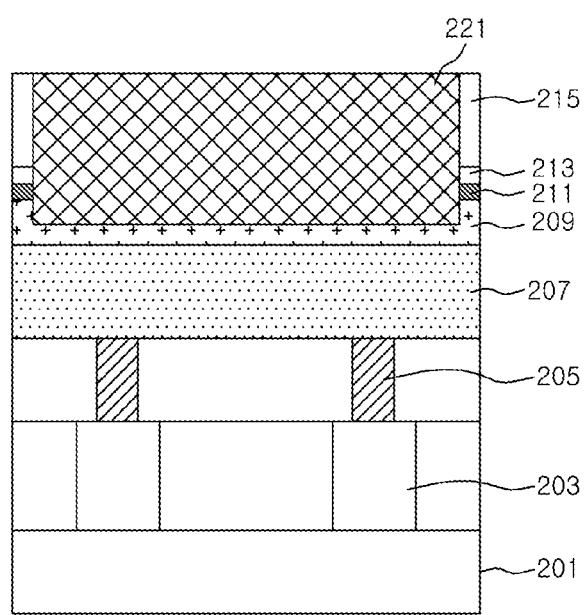
FIG. 8 is a cross-sectional view illustrating a method of fabricating a resistive memory device according to another exemplary embodiment of the inventive concept.

FIG. 8 is a cross-sectional view illustrating a method of fabricating a resistive memory device according to another exemplary embodiment of the inventive concept.

Figure 7:
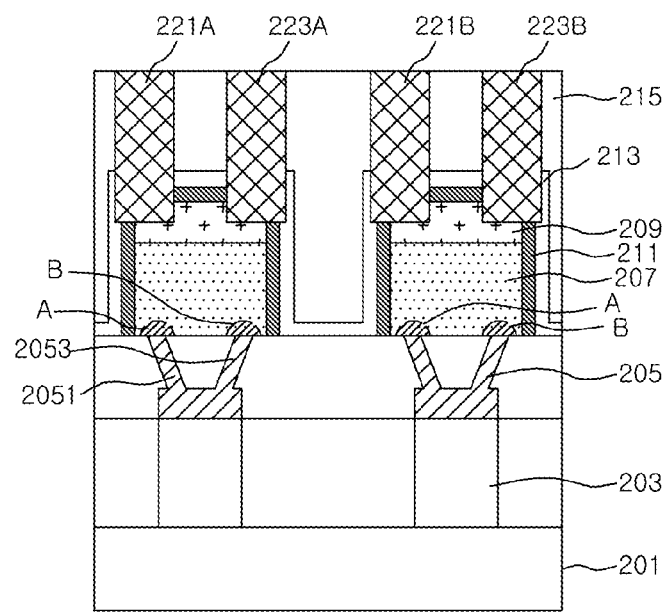

FIG. 8 is a cross-sectional view of the resistive memory device illustrated in FIG. 7 in a bit line direction. A contact hole is simultaneously formed with respect to a pair of cells adjacent in the bit line direction and a conductive material is deposited in the contact hole to form a contact plug 221.

When the bit line is formed as described above, two contact plugs are formed in each unit cell to be connected to bit lines, respectively, in a word line direction. In the embodiment shown in FIGS. 7 an 8, the word line direction would be parallel to the cross-sectional view, whereas the bit line direction would be perpendicular to the cross-sectional view. However, one contact plug is formed in a pair of cells adjacent in the bit line direction to be connected to the same bit line. Therefore, the total number of contact plugs and the total number of cells are the same.

In the resistive memory device according to the exemplary embodiment of the inventive concept described above, the lower electrode is electrically connected to the phase-change material pattern through the two nodes 2051 and 2053, and further the phase-change material pattern is connected to the respective bit lines through a pair of contact plugs 221A/223A and 221B/223B formed in both edge of the upper electrode pattern.

Therefore, as shown in FIG. 7, an amorphous region A is formed by a first current path through the first node 2051—the phase-change material pattern 207—the upper electrode 209—the first contact plug 221A—the bit line. Similarly, an amorphous region B is formed by a second current path through the second node 2053—the phase-change material pattern 207—the upper electrode 209—the second contact plug 221B—the bit line.

The MLC cell may be implemented by defining a case where amorphous regions are formed in portions of the phase-change material pattern 207 connected to the first node 2051 and the second node 2053 as date "11", a case where amorphous regions are not formed in the portions of the phase-change material pattern 207 connected to the first node 2051 and the second node 2053 as data "00", a case where an amorphous region is formed only in the portion of the phase-change material pattern 207 connected to the first node 2051 as data "10", and a case where an amorphous region is formed only in the portion of the phase-change material pattern connected to the second node 2053 as data "01".

That is, since the contact plugs 221A/223A and 221B/223B are connected to the individual bit lines, resistance values of the phase-change material pattern 207 are changed through control of the pulse applied to each bit line so that three or more pieces of data can be stored. Therefore, the resistance state of the phase-change material pattern can be controlled more easily and accurately as compared when a resistance state is changed through a single contact plug.

The above embodiments are illustrative and not limiting. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A resistive memory device, comprising:
   a lower electrode connected to a switching device and including a first node and a second node formed on a top thereof to be spaced at a fixed interval;
   a phase-change material pattern formed on the first node and the second node;
   an upper electrode formed on the phase-change material pattern;
   a conductive material layer formed on a top and outer sidewall of the upper electrode;
   a first contact plug formed on one edge of the top of the upper electrode to be connected to the upper electrode and the conductive material layer; and
   a second contact plug formed on the other edge of the top of the upper electrode to be connected to the upper electrode and the conductive material layer.

2. The resistive memory device of claim 1, further comprising:
   a first bit line connected to the first contact plug; and
   a second bit line connected to the second contact plug.

3. The resistive memory device of claim 2, wherein the first contact plug is shared by a pair of adjacent memory cells extending in a direction of the first bit line.

4. The resistive memory device of claim 2, wherein the second contact plug is shared by a pair of adjacent memory cells extending in a direction of the second bit line.

5. The resistive memory device of claim 1, wherein the conductive material is in contact with sidewalls of the phase-change material pattern.

* * * * *